(12) United States Patent
Lee et al.

(10) Patent No.: US 9,869,721 B2
(45) Date of Patent: Jan. 16, 2018

(54) SYSTEM AND METHOD FOR INSPECTING ASSEMBLED CONDITION OF ALTERNATOR

(71) Applicant: HYUNDAI MOTOR COMPANY, Seoul (KR)

(72) Inventors: Dong Chul Lee, Ulsan (KR); Mun Gu Kim, Ulsan (KR); Yeong Il Choi, Ulsan (KR); Jung Myoung Kim, Ulsan (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 0 days.

(21) Appl. No.: 14/854,862

(22) Filed: Sep. 15, 2015

(65) Prior Publication Data
US 2016/0274160 A1    Sep. 22, 2016

(30) Foreign Application Priority Data
Mar. 16, 2015 (KR) ........................ 10-2015-0036006

(51) Int. Cl.
*B60Q 1/00* (2006.01)
*G01R 31/34* (2006.01)
(Continued)

(52) U.S. Cl.
CPC ......... *G01R 31/343* (2013.01); *G01R 31/007* (2013.01); *B60W 2050/021* (2013.01)

(58) Field of Classification Search
CPC ...... B60W 50/02; B60W 50/0205; H02J 7/00; H02J 7/14; H02J 7/1461; G07C 5/008; G07C 5/08–5/0841; G01R 31/36; G01R 31/3693; G01R 31/3682; G01R 31/3689; G01R 31/006; G01R 31/343; G01R 31/007
(Continued)

(56) References Cited

U.S. PATENT DOCUMENTS 5,519,383 A * 5/1996 De La Rosa .... G01R 19/16542
340/455
6,363,303 B1 * 3/2002 Bertness ............... H02J 7/1461
340/439
(Continued)

FOREIGN PATENT DOCUMENTS

KR   10-0232352 B1   12/1999
KR   10-0245255 B1    2/2000
(Continued)

*Primary Examiner* — Thomas Mullen
(74) *Attorney, Agent, or Firm* — McDermott Will & Emery LLP

(57) ABSTRACT

The present disclosure provides a system and a method for inspecting an assembled condition of an alternator capable of inspecting a driving condition using a smart box monitoring sensor data received from an ECU of a vehicle and then determining whether the assembled condition of the alternator is bad. A system for inspecting an assembled condition of an alternator includes: a smart box configured to receive driving data of a vehicle from an ECU and determine whether the assembled condition of the alternator is bad based on the driving data of the vehicle; and a server configured to receive result data depending on whether the assembled condition of the alternator is bad from the smart box.

12 Claims, 3 Drawing Sheets

(51) Int. Cl.
*G01R 31/00* (2006.01)
*B60W 50/02* (2012.01)

(58) Field of Classification Search
USPC .................................. 340/455, 636.1, 636.2
See application file for complete search history.

(56) References Cited

U.S. PATENT DOCUMENTS

| | | | |
|---|---|---|---|
| 6,806,727 | B2 | 10/2004 | Thibedeau et al. |
| 2002/0011829 | A1 | 1/2002 | Thibedeau et al. |
| 2002/0195822 | A1* | 12/2002 | Sumimoto ................ H02J 1/14 290/41 |
| 2007/0103284 | A1* | 5/2007 | Chew ................ G01R 31/3693 340/438 |
| 2008/0258895 | A1* | 10/2008 | Yamaguchi .......... G07C 5/0816 340/455 |
| 2009/0200993 | A1* | 8/2009 | Maeda ................ H02J 7/1461 322/99 |
| 2009/0237037 | A1* | 9/2009 | Martin .................... H02P 9/305 322/27 |
| 2015/0154816 | A1* | 6/2015 | Chen ........................ G07C 5/08 701/29.1 |

FOREIGN PATENT DOCUMENTS

| | | |
|---|---|---|
| KR | 10-2004-0060235 A | 7/2004 |
| KR | 10-0773835 B1 | 11/2007 |
| KR | 10-2008-0042236 A | 5/2008 |
| KR | 10-1294088 B1 | 8/2013 |

* cited by examiner

SYSTEM AND METHOD FOR INSPECTING ASSEMBLED CONDITION OF ALTERNATOR

CROSS-REFERENCE TO RELATED APPLICATION

This application is based on and claims the benefit of priority to Korean Patent Application No. 10-2015-0036006, filed on Mar. 16, 2015 in the Korean Intellectual Property Office, the disclosure of which is incorporated herein in its entirety by reference.

TECHNICAL FIELD

The present disclosure relates to a system and a method for inspecting an assembled condition of an alternator, and more particularly, to a technology of automatically inspecting an assembled condition of an alternator.

BACKGROUND

As a power supply for a vehicle, a battery has been generally used. The battery may be continuously used by charging, and therefore needs to be charged as fast as possible every time when the battery is used.

Typically, a vehicle is equipped with an alternator, which supplies a current to electrical equipment along with the battery.

The alternator is configured to include a cylindrical housing, a stator and a rotor installed in the housing, a slip ring inserted into the rotor, and a brush contacting the slip ring. In this configuration, the stator and the housing are assembled with each other and the rotor rotates therein to serve as a power generator.

At a B+ terminal assembling operation of the alternator, a battery tool or an air tool is mainly used in a production and assembling process. Further, after the assembling work, an assembling torque confirmation work is performed using a torque wrench to confirm whether the assembled condition is abnormal. In this case, a worker manually does the assembling torque confirmation work, and therefore the inspection confirmation may be omitted and the work failure may occur. The omission of the inspection confirmation and the work failure may lead to the reduction in performance of the alternator and the occurrence of deterioration of the alternator.

SUMMARY

The present disclosure has been made to solve the above-mentioned problems occurring in the prior art while advantages achieved by the prior art are maintained intact.

An aspect of the present disclosure provides a system and a method for inspecting an assembled condition of an alternator capable of inspecting a driving condition using a smart box monitoring sensor data received from an electronic control unit (ECU) of a vehicle and then determining whether the assembled condition of the alternator is bad.

The foregoing and other objects, features, aspects and advantages of the present disclosure will be understood and become more apparent from the following detailed description of the present disclosure. Also, it can be easily understood that the objects and advantages of the present disclosure can be realized by the units and combinations thereof recited in the claims.

According to an exemplary embodiment of the present disclosure, a system for inspecting an assembled condition of an alternator includes: a smart box configured to receive driving data of a vehicle from an electronic control unit (ECU) and determine whether the assembled condition of the alternator is bad based on the driving data of the vehicle; and a server configured to receive result data depending on whether the assembled condition of the alternator is bad from the smart box.

The ECU may transmit and receive a battery charging signal to and from the alternator.

The system may further include: a fixed scanner configured to include a bar code connected to the ECU.

The driving data may include a speed of the vehicle, rpm of the vehicle, a throttle position sensor, a driving distance, a terminal state, a load state, a target duty, an FR duty, a current accumulation value, and a difference value between the targeted voltage and an actual voltage of a battery.

The smart box and the server may transmit and receive the driving data through a radio repeater by using Bluetooth.

The system may further include: an inspection status board connected to the server.

The server may store the result data depending on whether the assembled condition of the alternator is bad and transmit the result data depending on whether the assembled condition of the alternator is bad to a research institute.

According to another exemplary embodiment of the present disclosure, a method for inspecting an assembled condition of an alternator includes: receiving, by a smart box, driving data of a vehicle from the ECU; determining whether the assembled condition of the alternator is bad based on the driving data of the vehicle which are received by the smart box; and transmitting, by the smart box, result data depending on whether the assembled condition of the alternator is bad to a server.

The driving data may include a speed of the vehicle, rpm of the vehicle, a throttle position sensor, a driving distance, a terminal state, a load state, a target duty, an FR duty, a current accumulation value, and a difference value between the targeted voltage and an actual voltage of a battery.

The determining, by the smart box, whether the assembled condition of the alternator is bad may include: starting an inspection of the driving data; monitoring a preset target duty of the driving data, an FR duty, a difference value between a targeted voltage and an actual voltage of a battery, and a current accumulation value; and determining whether the assembled condition of the alternator is bad by comparing the preset driving data with the driving data continuously received from the ECU.

The determining whether the assembled condition of the alternator is bad may further include: outputting, by the smart box, a warning sound if it is determined that the assembled condition of the alternator is bad; and turning on a red LED after the warning sound is output.

The determining whether the assembled condition of the alternator is bad may further include: keeping, by the smart box, a green LED turned on without outputting the warning sound if it is determined that the assembled condition of the alternator is good.

The method may further include: after the transmitting of the result data depending on whether the assembled condition of the alternator is bad to the server, storing, by the server, whether the assembled condition of the alternator is bad; and displaying whether the assembled condition of the alternator is bad on an inspection status board or transmitting whether the assembled condition of the alternator is bad to a research institute.

BRIEF DESCRIPTION OF THE DRAWINGS

The above and other objects, features and advantages of the present disclosure will be more apparent from the following detailed description taken in conjunction with the accompanying drawings, in which.

DETAILED DESCRIPTION

The above-mentioned objects, features, and advantages will become more obvious from the following description described below in detail with reference to the accompanying drawings. Therefore, those skilled in the art to which the present disclosure pertains may easily practice a technical idea of the present disclosure. Further, in describing the present disclosure, in the case in which it is judged that a detailed description of a well-known technology associated with the present disclosure may unnecessarily make the gist of the present disclosure unclear, it will be omitted. Hereinafter, exemplary embodiments of the present disclosure will be described in detail with reference to the accompanying drawings.

Figure 1:
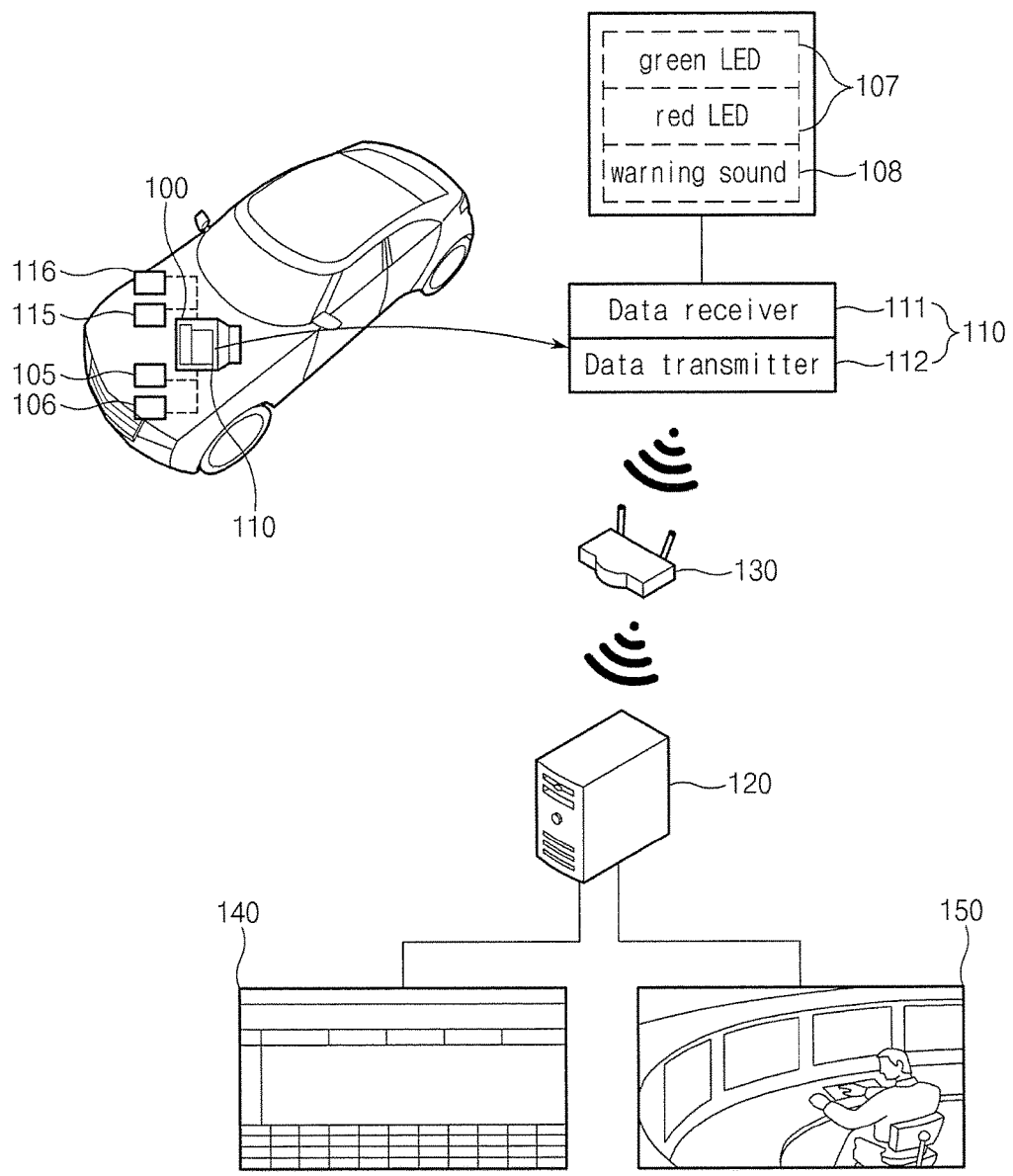
FIG. 1 is a diagram describing a configuration of a system for inspecting an assembled condition of an alternator according to an exemplary embodiment of the present disclosure.

FIG. 1 is a diagram describing a configuration of a system for inspecting an assembled condition of an alternator according to an exemplary embodiment of the present disclosure.

Referring to FIG. 1, a system for inspecting an assembled condition of an alternator may include an ECU 100 of a vehicle, a smart box 110, and a server 120. The system for inspecting an assembled condition of an alternator may further include an alternator 105 which is connected to the ECU 100 of the vehicle to transmit and receive a charging signal, a fixed scanner 115 or barcode 116 which may confirm a vehicle ID, and a radio repeater 130 which may transmit and receive information of the smart box 110 to and from the server 120. The vehicle may include a battery 106.

The ECU 100 is equipped in the vehicle and is called an electronic control unit which controls an engine of the vehicle, an automatic transmission, an anti-lock brake system (ABS), and the like and diagnoses the vehicle using a plurality of sensors which are equipped in the vehicle.

The smart box (or S-box) 110 has a portion 107 including red and green LEDs, and receives the driving data (vehicle data or sensor data) diagnosed by the ECU 100 and transmits the vehicle identification number (YIN) to the server 120. In particular, the smart box 110 may determine whether the assembled condition of the alternator is bad and a detailed method for determining whether the assembled condition of the alternator is bad will be described in detail with reference to FIGS. 2 and 3.

The server 120 receives the vehicle ID and the driving data from the smart box 110 and transmits the confirmed inspection items to the smart box 110, through the radio repeater 130 by using Bluetooth (BT), and the like. In some embodiments, the server 120 and the smart box 110 may directly communicate with each other, and thus, the radio repeater 130 may be omitted. The received vehicle ID and driving data which are received in the server 120 are stored.

Meanwhile, failure contents from the driving data may be displayed on an inspection status board 140 to enable a user to confirm the failure status and a research institute 150 may also query or analyze the failure status data.

Figure 2:
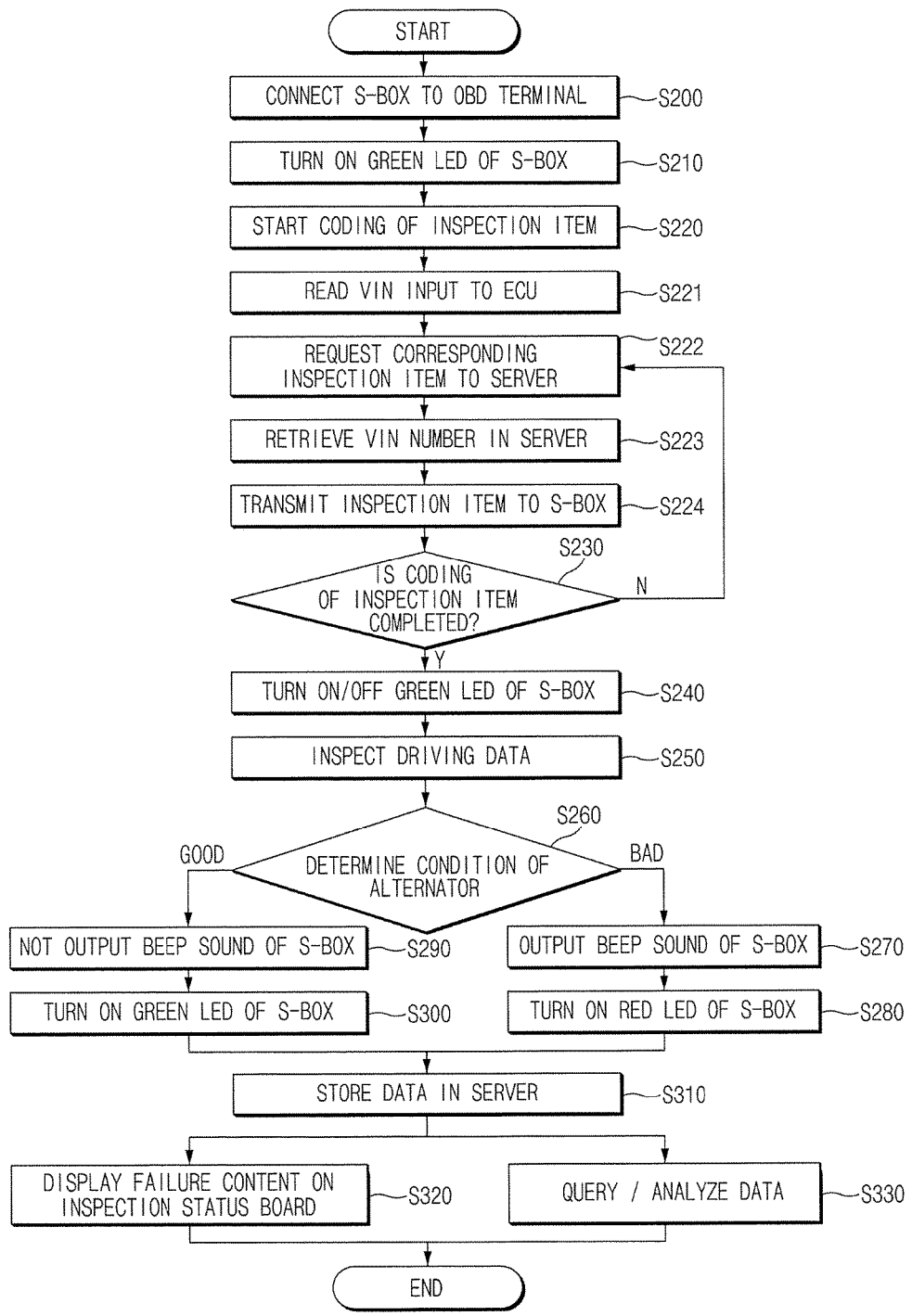
FIG. 2 is a diagram describing an inspection method using the system for inspecting an assembled condition of an alternator according to the exemplary embodiment of the present disclosure.

FIG. 2 is a diagram describing an inspection method using the system for inspecting an assembled condition of an alternator according to the exemplary embodiment of the present disclosure.

Referring to FIG. 2, the smart box of the system for inspecting an assembled condition of an alternator is connected to an OBD (On Board Diagnosis) terminal which is equipped in the vehicle (S200).

Next, when the smart box is connected to the OBD terminal which is equipped in the vehicle, a green LED of the smart box is turned on (S210). That is, a driver or passengers may confirm that the vehicle is connected to the smart box with their own eyes.

Next, the smart box codes the inspection items (S220). Here, a method for coding, by the smart box, inspection items will be described in detail below.

First, the smart box reads the vehicle ID (VIN) input to the ECU of the vehicle (S221). Here, the vehicle ID may be read by the fixed scanner and may be read by other sensors or apparatuses.

Next, the smart box requests the inspection items of the server (S222).

Next, the server retrieves the vehicle ID received from the smart box (S223).

Next, the server transmits the inspection items to the smart box (S224).

Next, the smart box completes the coding of the inspection items (S230).

Next, when the smart box completes the coding of the inspection items, the smart box turns on and off the green LED (S240). That is, the driver may be appreciated that the coding of the inspection items of the smart box is completed. When the coding of the inspection items is not completed by the smart box, the smart box may perform the step S222.

Next, the smart box starts the inspection of the driving data of the vehicle (S250).

Here, in the method for inspecting driving data of a vehicle, the smart box monitors a speed of the vehicle, rpm of the vehicle, a throttle position sensor (TPS), a driving distance, a battery state, a charging signal received from the alternator, or the like. That is, the smart box may continuously receive and monitor the driving data diagnosed by the ECU of the vehicle.

Next, the smart box determines whether the assembled condition of the alternator is bad while monitoring the driving data of the vehicle (S260).

That is, to determine whether an assembled condition of an alternator B+ terminal is abnormal (bad), the smart box may compare a preset target duty of the alternator, an FR duty, a difference value between a targeted voltage and an actual voltage of the battery, a current accumulation value, and the like with the driving data continuously received from the ECU of the vehicle. In detail, the target duty of the alternator represents a signal transmitting the charging signal required for the alternator from the ECU to the alternator and the FR duty represents a signal feed-backing the charging state from the alternator to the ECU through the FR terminal.

Here, a detailed order and method for determining whether the assembled condition of the alternator is bad by allowing the smart box to use the driving data received from the ECU of the vehicle will be described in detail with reference to FIG. 3.

Next, if it is determined that the assembled condition of the alternator is bad by determining whether the assembled condition of the alternator is bad, the smart box outputs a warning sound and then turns on a red LED (S270 and S280).

However, if it is determined that the assembled condition of the alternator is good, the smart box turns on the green LED without outputting the warning sound (S290 and S300).

Next, the smart box may determine whether the assembled condition of the alternator is bad and then may transmit and store result data to the server through the radio repeater (S310). The server may refer to the result data received from the smart box to display the failure of the assembled condition of the alternator on the inspection status board (S320).

Further, a research institute or relevant institutes may query and analyze the result data which represent whether the assembled condition of the alternator stored in the server is bad and utilize the queried and analyzed result data as a reference data for an ECU S/W robustness design (S330).

Figure 3:
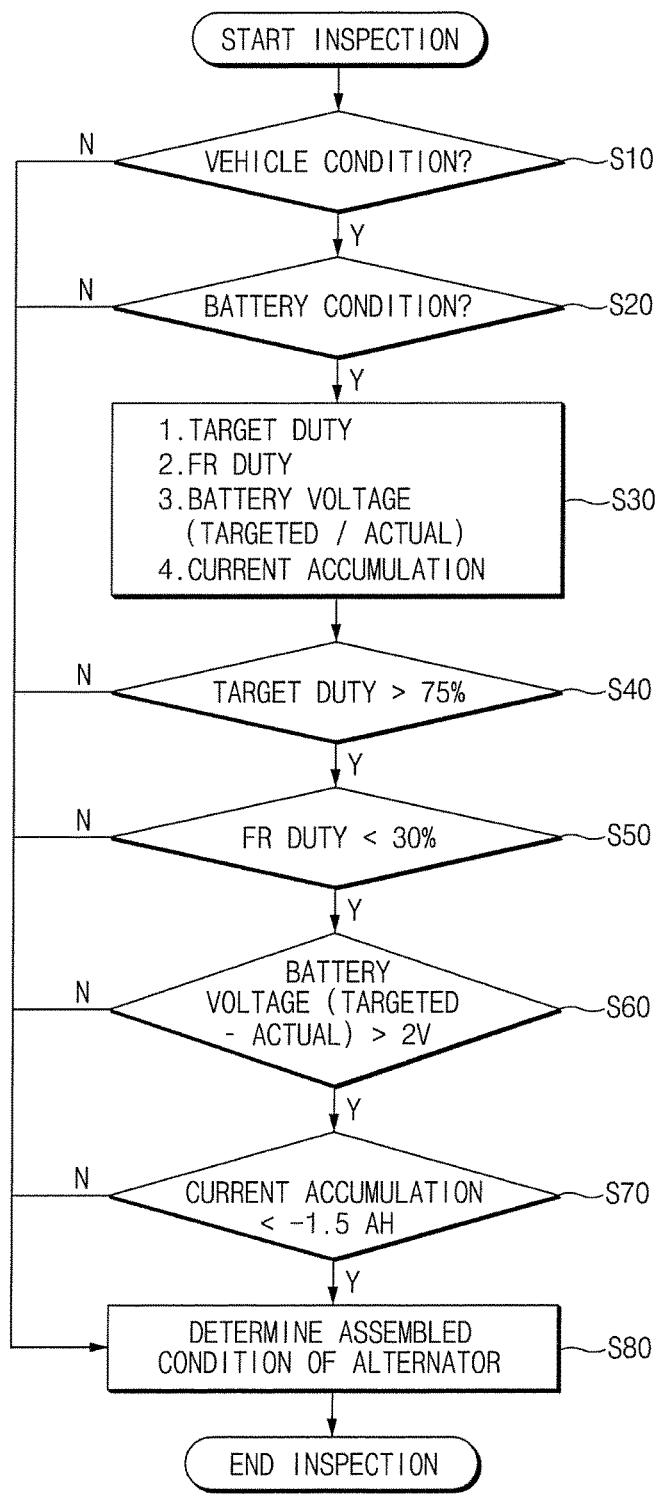
FIG. 3 is a diagram for determining whether the assembled condition of the alternator is bad by using a method for inspecting the driving data of the system for inspecting an assembled condition of an alternator according to the exemplary embodiment of the present disclosure.

FIG. 3 is a diagram for determining whether the assembled condition of the alternator is bad by using a method for inspecting driving data of the system for inspecting an assembled condition of an alternator according to the exemplary embodiment of the present disclosure.

Referring to FIG. 3, in the determining whether the assembled condition of the alternator is bad, the smart box monitors vehicle conditions including the speed of the vehicle, the rpm of the vehicle, the throttle position sensor (TPS), the driving distance, the battery state, the charging signal received from the alternator, and the like and the condition of the battery voltage (S10 and S20).

For example, the smart box may monitor actual operation conditions of the alternator including whether to satisfy the case in which the speed of the vehicle is equal to or more a predetermined speed, an engine RPM is in a predetermined range, for example from 500 rpm to 5000 rpm, or the battery voltage is in a predetermined range, for example, from 10 V to 16 V.

Next, the smart box compares the preset driving data with the driving data (the target duty of the alternator, the FR duty, the difference value between the targeted voltage and the actual voltage of the battery, and the current accumulation value) received from the ECU (S30).

Here, the target duty of the alternator represents the value transmitting the charging signal required for the alternator from the ECU to the alternator and the FR duty represents the value feed-backing the charging state from the alternator to the ECU through the FR terminal.

Next, the smart box determines whether the target duty of the alternator is equal to or more than a first predetermined value, for example, 75% (S40).

Next, the smart box determines whether the FR duty of the alternator is equal to or less than a second predetermined value, for example, 30% (S50).

Next, the smart box determines whether the difference value between the targeted voltage and the actual voltage of the alternator is equal to or more than a predetermined differential, for example, 2 V (S60).

Next, the smart box determines whether the current accumulation value of the alternator is equal to or less than a predetermined current accumulation value, for example, −1.5 Ah (S70).

Next, if it is determined that the target duty of the alternator is more than the first predetermined value, for example, 75%, the FR duty is less than the second predetermined value, for example, 30%, and the difference value between the targeted voltage and the actual voltage of the alternator is more than the predetermined differential, for example, 2 V, and the current accumulation value of the alternator is less than the predetermined current accumulation value, for example, −1.5 Ah, the smart box determines that the assembled condition of the alternator is bad (S80).

However, if it is determined that the target duty of the alternator is equal to or less than the first predetermined value, for example, 75%, the FR duty is equal to or more than the second predetermined value, for example, 30%, and the difference value between the targeted voltage and the actual voltage of the alternator is equal to or less than the predetermined differential, for example, 2 V, and the current accumulation value of the alternator is equal to or more than the predetermined current accumulation value, for example, −1.5 Ah, the smart box determines that the assembled condition of the alternator is good.

As described above, according to the exemplary embodiments of the present disclosure, it is possible to prevent the engine from stalling while the vehicle is driving and prevent problems due to the deterioration of the alternator, by determining whether the assembled condition of the alternator is bad.

Further, it is possible to record the history of the quality data of the vehicle and enhance the detection ability of the failure of the electronic equipment of the vehicle by switching the manual inspection method which confirms the assembling torque by the worker to the automatic inspection method which inspects the assembled condition using the smart box monitoring sensor data of the vehicle.

Hereinabove, although the present disclosure has been described with reference to restrictive configurations and the accompanying drawings, the present disclosure is not limited thereto, but may be variously modified and altered by those skilled in the art to which the present disclosure pertains without departing from the spirit of the present disclosure and equivalents to the following claims.

What is claimed is:

1. A system for inspecting a condition of an alternator, comprising:
a smart box configured to receive driving data of a vehicle from an electronic control unit (ECU) and determine the condition of the alternator based on the driving data of the vehicle; and
a server configured to receive result data, from the smart box, depending on the condition of the alternator.

2. The system according to claim 1, wherein the ECU transmits and receives a battery charging signal to and from the alternator.

3. The system according to claim 1, wherein the driving data include a speed of the vehicle, a throttle position sensor, a driving distance, a target duty, an FR duty, and a difference value between a targeted voltage and an actual voltage of a battery.

4. The system according to claim 1, wherein the driving data is, transmitted and received between the smart box and the server through a radio repeater by using Bluetooth.

5. The system according to claim 1, further comprising:
an inspection status board connected to the server.

6. The system according to claim 1, wherein the server stores the result data depending on the condition of the alternator and transmits the result data depending on the condition of the alternator to a research institute.

7. A method for inspecting a condition of an alternator, comprising:

receiving, by a smart box, driving data of a vehicle from an electronic control unit (ECU);

determining the condition of the alternator based on the driving data of the vehicle which are received by the smart box; and transmitting, by the smart box, result data depending on the condition of the alternator to a server.

8. The method according to claim 7, wherein the driving data include a speed of the vehicle, a throttle position sensor, a driving distance, a target duty, an FR duty, and a difference value between a targeted voltage and an actual voltage of a battery.

9. The method according to claim 7, wherein the determining, by the smart box, the condition of the alternator includes:

monitoring a preset target duty of the driving data, an FR duty, and a difference value between a targeted voltage and an actual voltage of a battery; and determining the condition of the alternator at least based on the driving data received from the ECU.

10. The method according to claim 9, wherein the determining the condition of the alternator further includes:

outputting, by the smart box, a warning sound depending on the condition of the alternator; and turning on a red LED after the warning sound is output.

11. The method according to claim 9, wherein the determining the condition of the alternator further includes:

keeping, by the smart box, a green LED continuously turned on without outputting a warning sound if it is determined that the condition of the alternator is good.

12. The method according to claim 7, further comprising:

after the transmitting of the result data depending on the condition of the alternator to the server, storing, by the server, the condition of the alternator; and displaying the condition of the alternator on an inspection status board or transmitting the condition of the alternator to a research institute.

* * * * *